United States Patent [19]

Swanson

[11] 4,164,714
[45] Aug. 14, 1979

[54] POLYPHASE PDM AMPLIFIER

[75] Inventor: Hilmer I. Swanson, Quincy, Ill.

[73] Assignee: Harris Corporation, Cleveland, Ohio

[21] Appl. No.: 836,832

[22] Filed: Sep. 26, 1977

[51] Int. Cl.² .............................................. H03F 3/38
[52] U.S. Cl. .................................. 330/10; 330/207 A; 330/251; 332/31 R
[58] Field of Search ...................... 330/10, 207 A, 251; 332/31 R

[56] References Cited
U.S. PATENT DOCUMENTS

| | | | |
|---|---|---|---|
| 3,260,912 | 7/1966 | Gregory | 330/251 X |
| 3,579,132 | 5/1971 | Ross | 330/251 |
| 3,585,517 | 6/1971 | Herbert | 330/257 X |
| 3,629,616 | 12/1971 | Walker | 330/207 A |
| 3,648,186 | 3/1972 | Kahn | 330/10 |
| 4,004,246 | 1/1977 | Hamada | 330/251 X |

Primary Examiner—James B. Mullins

[57] ABSTRACT

A system wherein input signals are pulse duration modulated to provide a plurality of pulse trains having a predetermined phase relation therebetween. The plurality of pulse trains control the operation of separate switching elements. The output of the switching elements are summed and filtered to provide a composite amplified signal. The number of switching elements and the number of pulse trains are determined by the desired fidelity of operation and the frequency response of the switching elements. The system is particularly useful as a power audio amplifier for use in modulating stages of RF transmitters.

25 Claims, 10 Drawing Figures

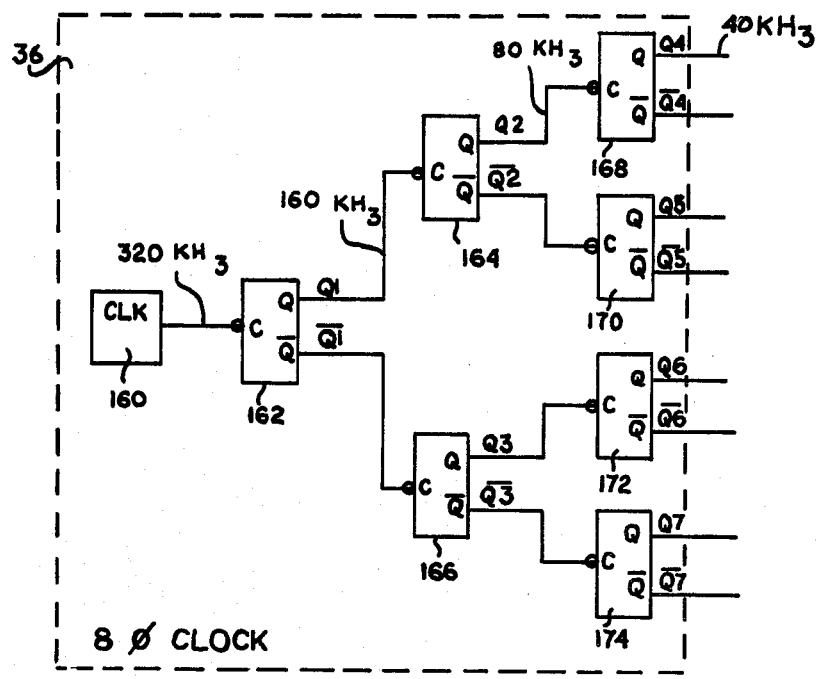
FIG. 7
FIG. 5
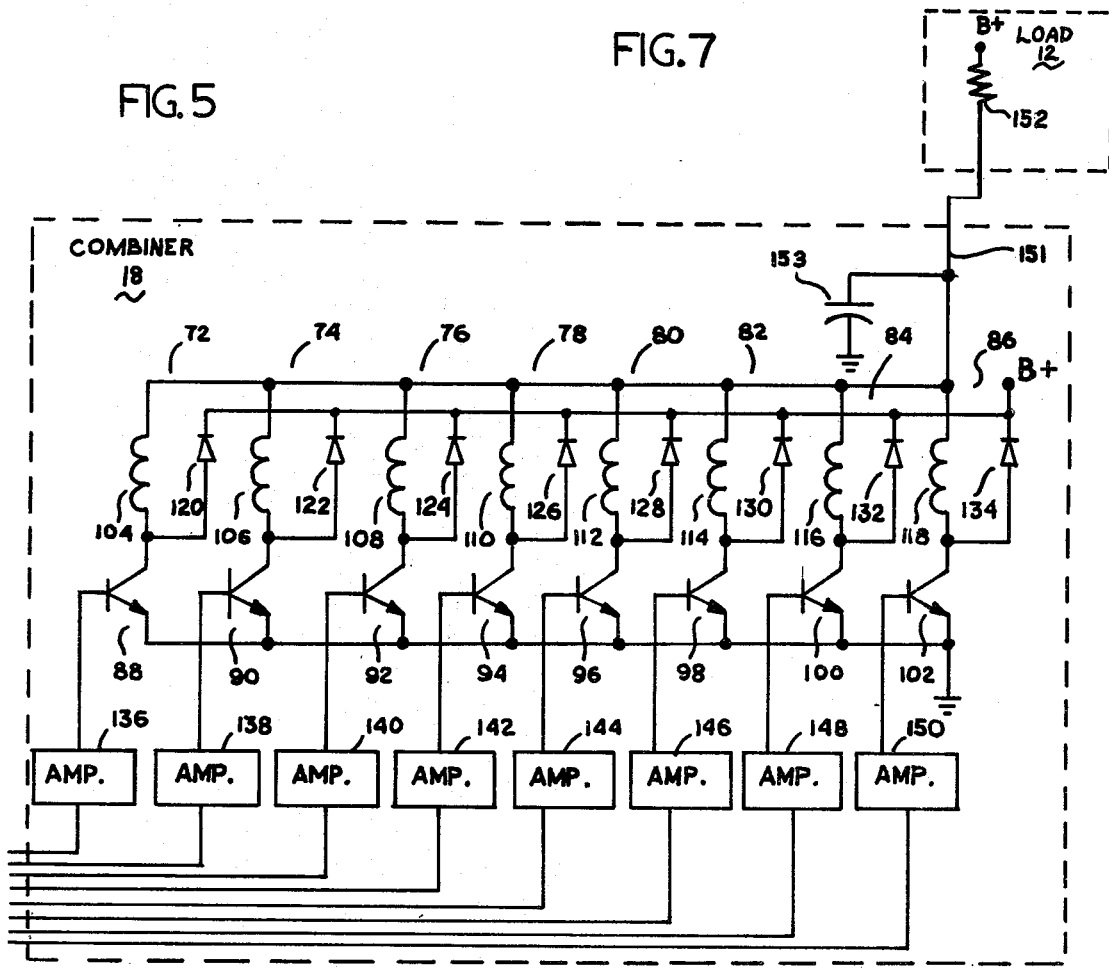

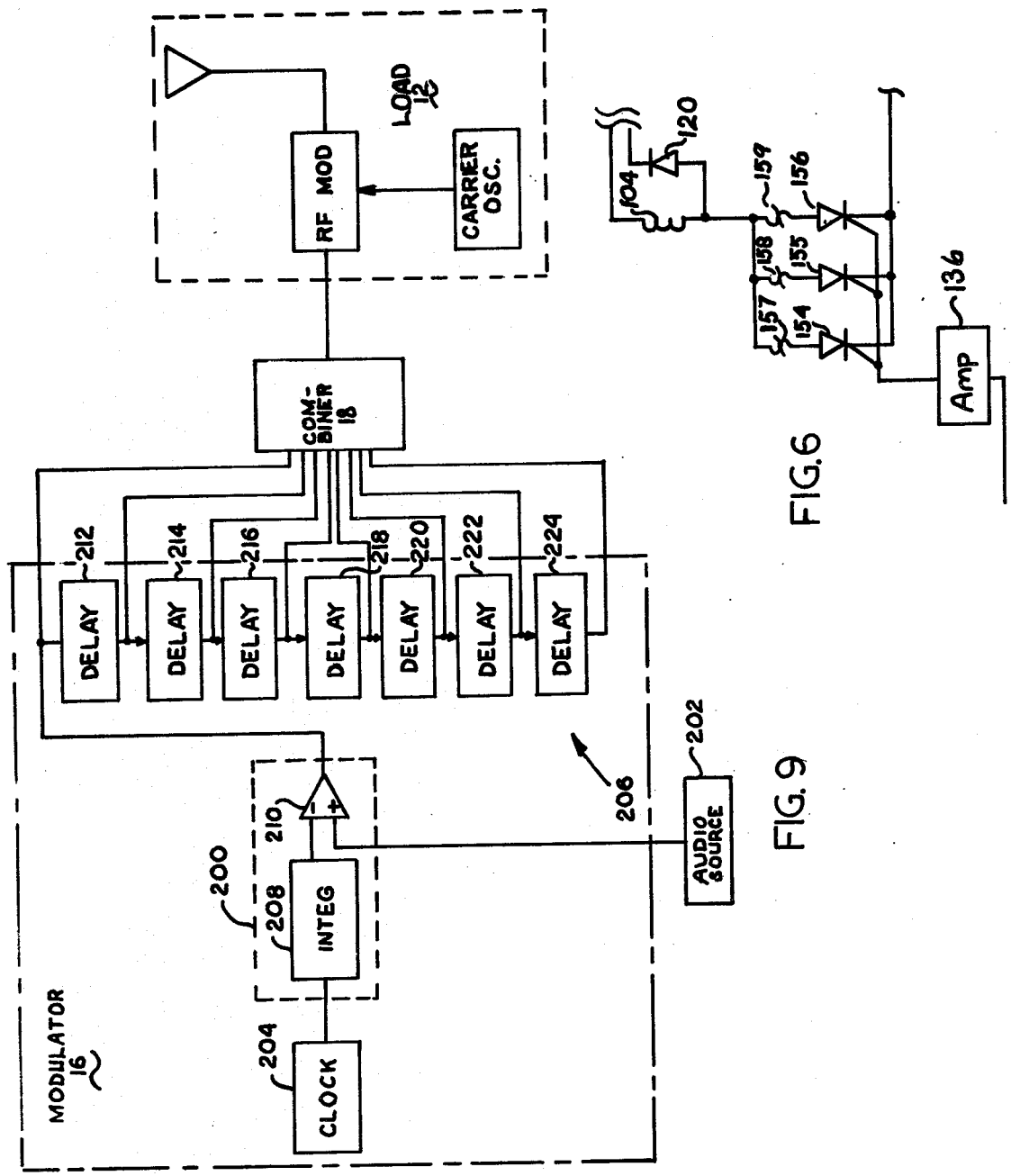

POLYPHASE PDM AMPLIFIER

BACKGROUND AND FIELD OF THE INVENTION

The present invention relates to amplifiers in general, and more particularly to amplifiers which employ pulse duration modulation.

Although the amplifier circuit including the invention will be described in the context of a modulator circuit for an RF transmitter, it should be understood that the invention is not limited to use in this application. Rather, the invention may be used for signal amplifying purposes in general, particularly for those uses requiring power amplification such as hi-fidelity audio systems, public address systems, etc.

In the design of amplifier circuits, the output stage is generally the most critical since it must operate at the highest power level over the entire range of frequencies to be amplified. This is particularly true if the output devices are to be semiconductor devices. The present stage of development of high-powered semiconductor devices is such that the lower cost off-the-shelf devices do not have the desired combination of power output and frequency response. It has been recognized that the inadequate power handling capability of these devices can be circumvented to some extent by connecting a large number of the devices in parallel and driving them with the same signal so that the total power gain is adequate. This approach is exemplified by the patents to Holmes, U.S. Pat. No. 3,348,151; Slenker et al., U.S. Pat. No. 3,022,465; and Schmitt, U.S. Pat. No. 3,443,239. Often, however, special high-cost semiconductor devices must be used to provide the frequency response at the desired power level. This is the case in pulse duration modulation (PDM) amplifiers, wherein not only is the output stage required to respond to the range of signals to be amplified, but must also respond to the switching frequency of the PDM amplifier.

PDM amplifiers have been found to be particularly useful as power amplifiers for modulation stages of RF transmitters. In AM radio broadcasting, Class C or Class D radio frequency modulation stages are commonly employed in order to achieve high efficiency of operation. These RF modulation stages do operate quite efficiently (on the order of 75% efficiency), but also inherently require a large amount of modulation power. For example, a 5 kw RF modulator would require nearly 2.5 kw of audio modulating signal power. Obviously, a high efficiency audio amplifier must also be provided in a system of this sort if a net gain in operation efficiency is to result. Pulse duration modulation (PDM) amplifiers have effectively been used for this purpose since they inherently operate at high levels of efficiency.

System employing PDM amplifier stages are disclosed in the patents to Swanson, U.S. Pat. No. 3,506,920; Heising, U.S. Pat. No. 1,655,543; Bruene et al., U.S. Pat. No. 3,413,570; and Kahn, U.S. Pat. No. 3,648,186.

One problem with these PDM amplifiers arises from the need to use as high a switching frequency in the amplifier as possible in order to preserve high fidelity reproduction of the input signals. Although low fidelity reproduction can be provided with switching speeds which are only two or three times greater than the highest frequency which is to be amplified, in AM broadcasting and other high fidelity applications it has been found that the switching speed should be at least seven times that of the highest frequency of the audio signal in order for the stringent fidelity requirements thereof to be met. Thus, in prior art PDM systems such as Swanson U.S. Pat. No. 3,506,920 the switching speed has been in excess of 70 kHz in order to amplify an audio signal having a bandwidth of 10 kHz. The use of even higher switching frequencies would be desirable from a system performance standpoint, but the implementation of higher frequency switching has previously been impractical due to the additional cost which would be incurred in attempting to provide switching devices capable of operating effectively at these frequencies. Moreover, the off-the-shelf power transistors which would preferably be used in these systems presently only have design operating ranges of approximately 20 to 40 kHz, while currently available power SCR's have a design operating frequency of around 10 kHz. Thus, the devices could not even be employed in systems operating at 70 kHz.

An added problem involves the need for a filter at the output of the PDM amplifier to recover the amplified audio signal from the pulse duration modulated signal. This filter must be capable of removing the frequency component corresponding to the switching signal without significantly affecting the frequency spectrum of the audio component. In prior art systems as mentioned above this meant that the filter would have to provide a very high level of attenuation of a 70 kHz signal while being essentially transparent to a 10 kHz signal. To provide this high degree of filtering, it was necessary in the prior art to use a plural-section filter, the design of which was complicated and rather expensive. The inclusion of such a filter, however, introduced phase shift in the audio signal which caused distortion and overshoot thereof.

This was particularly troublesome in broadcasting applications since many radio stations increase the transmitter modulation level to the point of clipping in order to transmit as "loud sounding" a signal as possible. The level at which this clipping would occur would be set to correspond to the maximum modulation level permitted by the FCC. Since the filter at the output of the PDM amplifier introduced distortion into the square wave signal which resulted from this clipping action, it was possible for the square wave signal to overshoot the clipping level, and thus the maximum modulation level. If FCC modulation restrictions were not to be exceeded, then, it was necessary to reduce the gain of the audio signal below the level which would otherwise be permissible if the distortion occassioned by the PDM output filter were reduced or eliminated.

One manner in which a reduction in distortion could be accomplished is by increasing the switching speed of the PDM amplifier. A reduced amount of filtering would then be required, leading to a corresponding reduction in the distortion introduced thereby. As stated previously, however, an increase in the switching speed has not been feasible in the past.

SUMMARY OF THE INVENTION

It is an object of the present invention to provide an amplifier which overcomes the problems of prior systems in a cost-effective manner.

It is another object of the present invention to provide an efficient power amplifier which is capable of very high fidelity amplification.

It is yet another object of the present invention to provide a power amplifier having an output stage in which low cost, off-the-shelf semiconductors may be employed.

It is still another object of the present invention to provide a PDM amplifier circuit which provides improved fidelity while operating at lower switching speeds than previous PDM amplifiers.

It is a further object of the invention to provide a PDM amplifier having significantly reduced output filtering requirements.

It is an even further object of the invention to provide a high power PDM amplifier providing enough flexibility in design that any number of different high power switching elements may alternatively be used in the output stage thereof.

It is also an object of the present invention to provide a high power PDM amplifier wherein the high power switching elements included in the output stage thereof are operated at a relatively low frequency and yet the effective rate at which the input signal is sampled is much greater.

It is a more specific object of the present invention to provide a high power PDM amplifier in which high power semiconductor elements may cost-effectively be employed as the high power switching elements thereof.

It is yet another object of the invention to provide an AM broadcasting system using an amplifier embodying the foregoing objects.

These and other objects are provided in an amplifier which receives a time varying input signal and converts it into a plurality of pulse trains which are phase displaced from one another by a known amount. These pulse trains are then recombined to form a composite signal of increased magnitude and of substantially the same waveform as the input signal.

In the illustrated embodiments, the circuitry which is included for combining the pulse trains includes a plurality of switching circuits, each one of which is controlled by one of the pulse trains. These switching circuits are coupled to an output circuit which combines and filters the pulse trains so as to recover the input signal in amplified form.

In one embodiment, plural PDM modulators are provided to each produce one of the pulse trains. The width of the pulses varies with the amplitude of the input signal. The modulators are all operated at a common pulse repetition rate, but with discrete phase displacements therebetween. Each pulse train controls a separate high power switching element. These switching elements are coupled to an output so that an amplified input signal is provided, corresponding to a filtered composite of the pulse-type output signals generated by the modulators.

In another embodiment, a single PDM modulator provides a pulse train wherein the width of the pulses varies with the amplitude of the input signal. This pulse train is directed through plural delay circuits so that a plurality of phase delayed signals are provided. As in the other embodiment, each of these signals controls a separate high power switching element.

In accordance with a more specific aspect of the present invention, a high efficiency RF amplitude modulation system is provided which includes a PDM amplifier as set forth above.

The present invention allows the fidelity of the amplifier to be established independently of the switching rate of the output devices. This is possible because the rate at which the input signal is "sampled" depends not only upon the switching rate, but also upon the number of differently-phased modulators which are employed. The switching rate may thus be set to conform to the design operating frequency of the particular switching devices selected. The fidelity of the amplifier will then be selected by selecting the number of differently phased modulators which will be used. Since this allows the design of a high-fidelity amplifier using switching rates which are much lower than would have previously been acceptable, it is feasible to use lower cost, off-the-shelf semiconductors whose use was limited in the past by their limited frequency response. Also, since these switching devices operate at greater efficiency at these relatively low switching rates, an improvement in the overall operating efficiency of the amplifier is provided. This allows reduced cooling and power supply requirements.

The present invention also allows a significant reduction in the amount output filtering required. This is mainly because of two factors. First, the ripple frequency of the output may be made quite high, since it will be equal to a multiple of the actual switching rates of the output switching. Additionally, it has been found that the mere additive combination of the pulse trains serves to partially recover the amplified signal. Because of these two effects, it is possible to recover a high fidelity amplified signal with much less filtering than would have previously been required.

BRIEF DESCRIPTION OF THE DRAWINGS

The foregoing and other objects and advantages of the present invention will become more readily apparent from the following description of the preferred embodiments, as taken in conjunction with the accompanying drawings, which are a part hereof, and wherein:

FIG. 5 is a schematic illustration of a combining circuit for use in the system of FIG. 1 and which employs high power transistor switching elements;

FIG. 6 is a schematic illustration of a portion of a combining circuit which employs SCR's as the switching elements.

FIG. 7 is a schematic illustration of an 8-phase clock for use in the system of FIG. 2;

FIG. 9 is a diagrammatic illustration of a second embodiment of the present invention.

DETAILED DESCRIPTION

As mentioned previously, the invention will be described mainly in the context of a modulator stage for an RF transmitter. Again, however, it should be understood that the invention clearly has broader application to amplification of signals, in general, and will have particular utility in those areas in which power amplification is required.

Figure 1:
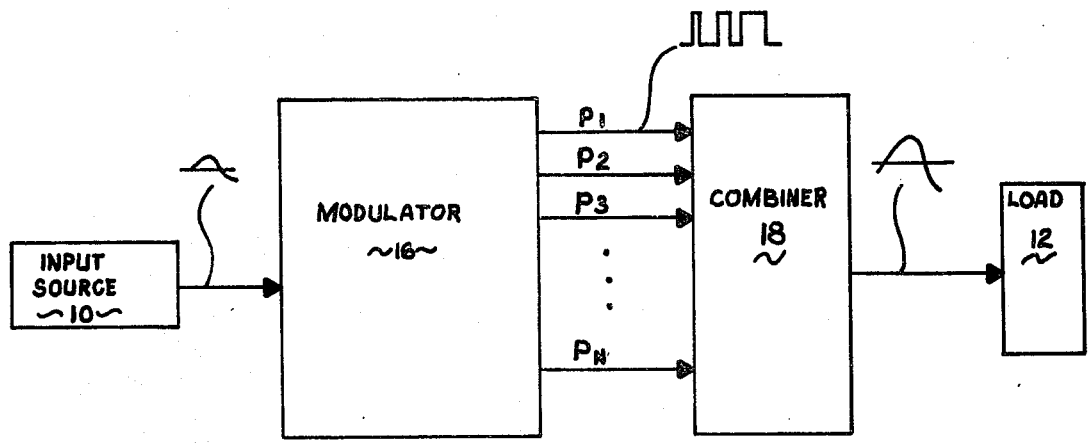
FIG. 1 is a general block diagram of an amplifier in accordance with the present invention.

Referring now to FIG. 1, there is shown a general block diagram of an amplifier system. An input source 10 provides signals which are amplified and supplied to a load 12 by means of an amplifier, generally indicated at 14. In accordance with the present invention, amplifier 14 includes a modulator 16 and a combiner 18. Modulator 16 converts the input signal into a plurality of pulse trains, $P_1$-$P_N$. Each pulse train is composed of periodic pulses, with the duration of the pulses being modulated by the input signal. Although the pulse repetition rates of the pulse trains are equal, the pulse trains are phase displaced from one another by a selected amount. Combiner 18 combines the various pulse trains so as to recover an amplified signal therefrom; this amplified signal is supplied to the load 12.

Figure 2:
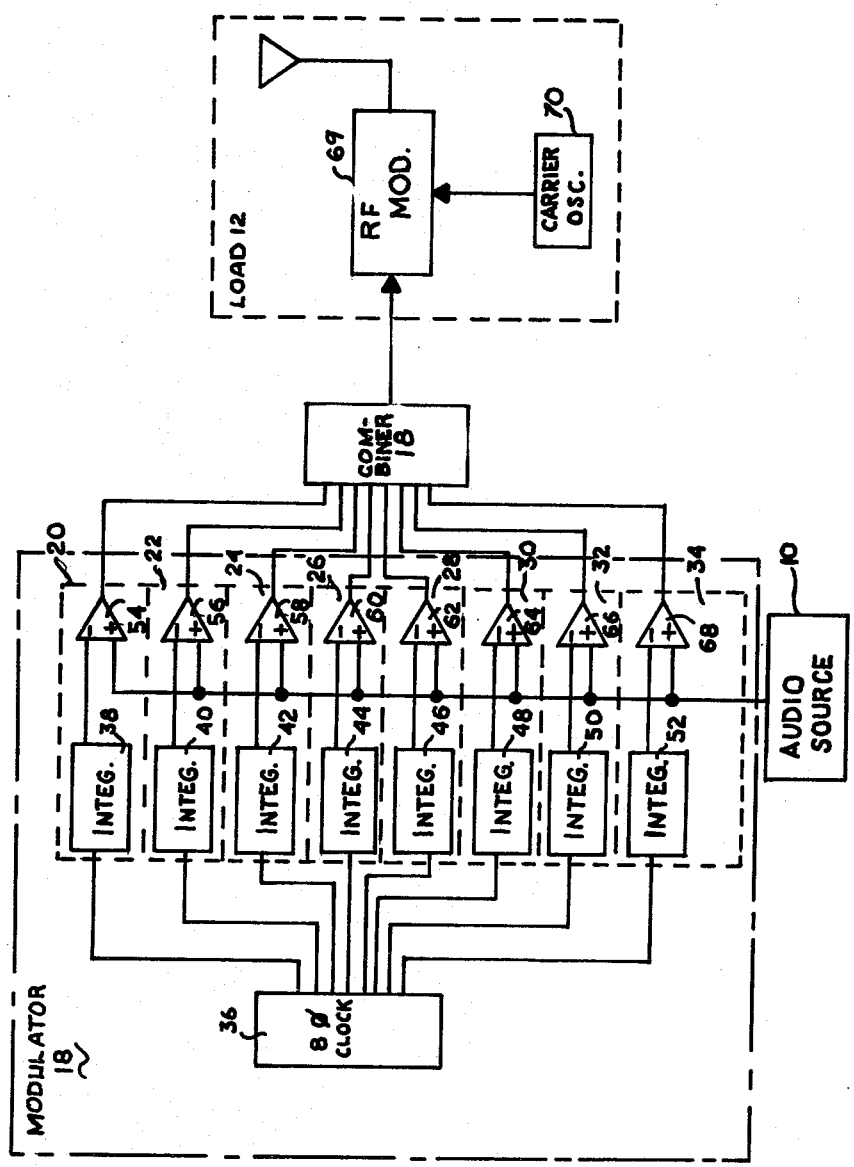
FIG. 2 is a more specific block diagram of one embodiment of a high efficiency amplitude modulation system which includes an eight phase pulse duration modulation amplifier in accordance with the present invention.

One specific embodiment of modulator 16 is illustrated in FIG. 2. In this embodiment, modulator 16 includes eight individual pulse duration modulators 20-34. An 8-phase clock 36 provides square wave synchronizing signals to each of the pulse duration modulators. The eight square wave signal outputs of 8-phase clock 36 operate at the same frequency, but have discrete phase delays therebetween which are selected so that the eight square wave signals have equally spaced phase delays ranging from 0° to 315°. The square wave signals supplied by each output line of 8-phase clock 36 are thus each delayed by an amount of substantially 45° with respect to the output which is next closest in phase.

Each pulse duration modulator 20-34 may, for example, take the form described in the patent to Swanson, U.S. Pat. No. 3,440,566. In FIG. 2, each modulator is illustrated as including a corresponding integrator and corresponding comparator.

The eight outputs of clock 36 are each directed to a corresponding integrator circuit 38-52 associated with a corresponding pulse duration modulator 20-34. These integrators each integrate the square wave signal supplied thereto to provide a corresponding triangular wave signal. These triangular wave signals are each, in turn, directed to a comparator circuit 54-68 which compares the amplitude of the triangular wave signal with the amplitude of the signal supplied by signal source 10, illustrated as being a source of audio frequency signals. The results of this comparison will in each case be a PDM output signal having a phase and frequency established by the corresponding triangular wave signal.

Since the square wave signals which are used to generate the triangular wave signals all operate at the same frequency but with discrete phase delays therebetween, the pulse duration modulated outputs of comparators 54-68 will similarly operate at the same frequency but with discrete phase delays therebetween. The net result will be that the audio signal will be "sampled" eight times in each cycle of clock 36. Since clock 36 is illustrated as operating at 40 kHz, the effective sampling rate is 320 kHz.

Figure 3:
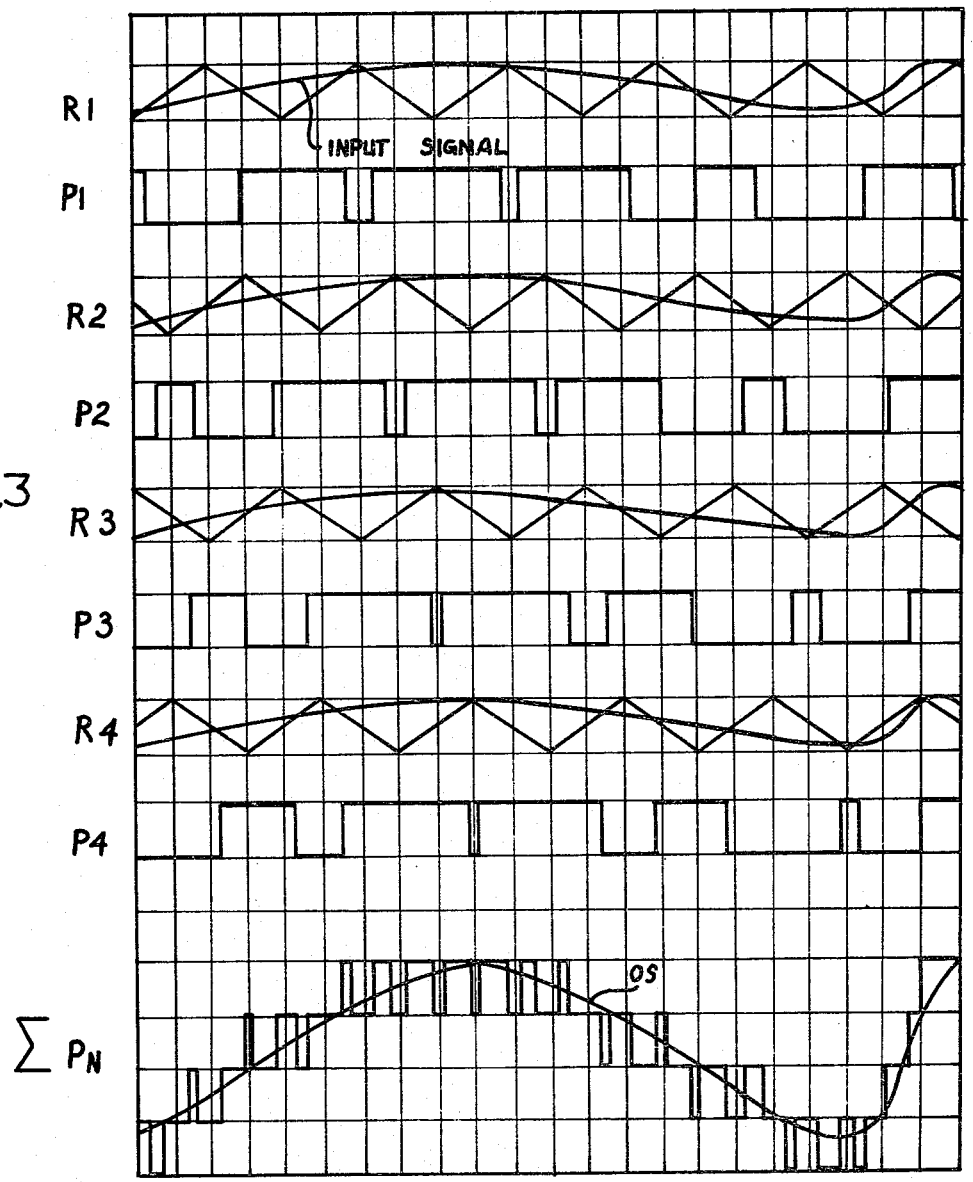
FIG. 3 is an illustration of the waveforms which would be found in a four phase PDM amplifier similar to the one shown in FIG. 2.

FIG. 3 provides a graphic representation of the operation of a modulator similar to that shown in FIG. 2. For simplicity of illustration, FIG. 3 represents the operation of a modulator utilizing only four individual modulators, phased 90° apart, rather than eight modulators as shown in FIG. 2. The triangular waveforms R1-R4 correspond to the reference signals provided by the four integrators. It will be noted that these reference signals are spaced apart from one another by a phase angle of 90°.

The complex waveform which is superimposed on each triangular waveform represents the input signal, against which each triangular wave is compared. The waveforms P1-P4 represent the results of this comparison. Thus, when the input signal is greater in magnitude than the reference signal, the output of the comparator will be at a high voltage level; when the input signal is smaller in magnitude than the reference signal, the output of the comparator will be at a low voltage level. The resulting waveforms (P1-P4) are pulse trains comprised of periodic pulses wherein the duration of the pulses is modulated by the input signal. Since the reference signals are phase displaced from one another, the PDM pulse trains will be similarly phase displaced. Thus, each modulator may be characterized as "sampling" the input signal at different times than the other modulators.

The bottom waveform in FIG. 3 corresponds to the additive combination of the four PDM signals. Several features of this waveform should be noted. First, the sum signal has the same general form as the input signal; the mere act of adding the signals together (a function performed by combiner 18) has functioned to partially recover an amplified input signal. Second, the repetition rate of the pulses included in the combined signal (i.e., the output ripple frequency) is much greater than the repetition rate of the pulses in the individual pulse trains. In fact, it is four times greater, since four phased modulators are used. As will be made clearer hereinafter, these two factors significantly reduce output filtering requirements. After only moderate filtering, the amplified output signal OS will be recovered.

Figure 4A:
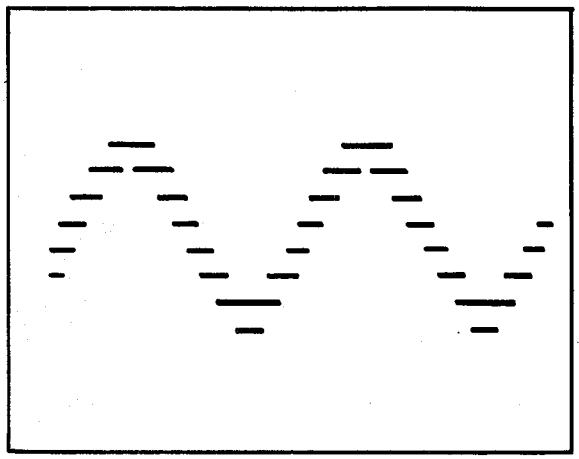
FIGS. 4(a) and 4(b) are graphical representations of the output signals provided by the amplifier of FIG. 2 under specified conditions.
Figure 4B:
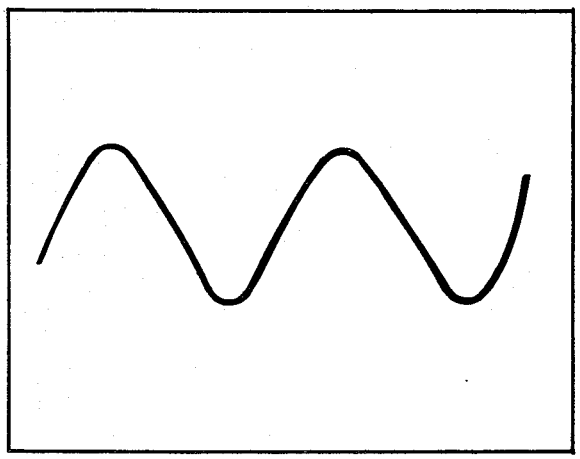

These effects are directly related to the number of modulators used; the greater the number of modulators, the more pronounced these effects will become. When eight modulators are used, as illustrated in FIG. 2, the input signal will be "sampled" eight times for each clock cycle. The output ripple frequency will then be eight times the rate at which each modulator is operated, and the unfiltered output will even more closely resemble the input signal. This may be seen in FIG. 4(a), which is a representation of the waveform which would appear on the screen of an oscilloscope if it were connected to the output of combiner 18 (under the conditions wherein no filtering is present, the audio input is a sine wave of 2000 Hz, and the clock rate is 40 kHz). FIG. 4(b) is a representation of the waveform of FIG. 4(a), after being filtered through use of a low pass filter having a cutoff frequency of 150 kHz.

The effective rate at which the input is sampled may thus be adjusted as desired, independently of the clock rate, by altering the number of pulse duration modulators. If, for example, ten modulators were included and were operated at 40 kHz (and different phases), the effective sampling rate would instead be 400 kHz. Although the modulators need not necessarily be operated at any particular phase spacing, greater fidelity will be secured if equal phase separations are used, as illustrated.

The outputs of modulators 20-34 are in each case directed to a combiner 18 which amplifies, combines, and filters these signals to provide the amplified audio signal to the load 12. In the Figure, load 12 is represented as an RF modulator 69, which may comprise an anode or cathode modulated class C or class D amplifier. It will be noted that this amplifier system allows the use of a current path between the amplifier and the RF modulator 69 over which DC current will flow. This system thus secures the advantages of this DC current path, as set forth in the previously referred to patent to Swanson, U.S. Pat. No. 3,506,920. RF modulator 69 amplitude modulates an RF carrier signal supplied by carrier oscillator 70 in accordance with the amplified audio signal. It will be understood that the load 12 could as easily be a different type of device, such as a speaker system.

Referring now to FIG. 5, a combiner 18 which could be used in the amplifier 10 is shown. Combiner 18 includes a number of parallel connected switching circuits 72–86 which are driven in a periodic-sequential manner by the outputs of modulators 20–34. In the illustrated embodiment, each of these switching circuits includes a corresponding high power semiconductor switching element 88–102, illustrated as being NPN transistors, and a corresponding inductor 104–118 which is connected in the collector circuit of the corresponding switching element. Each of the switching circuits also includes a clipping diode 120–134 interconnecting the collector of the respective switching transistor with a B+ supply voltage. The purpose of these diodes is to prevent excessive build-up of voltage across the corresponding switching element due to the inductive load. These diodes also serve to increase the efficiency of operation of the system by dumping inductor current back into the B+ power supply when the corresponding switching element turns off.

Each of the switching transistors 88–102 is controlled by the output of a corresponding modulator circuit as amplified by a corresponding amplifier 136–150. Amplifiers 136–150 are included to provide the current necessary to drive high power transistors 88–102. Preferably, the amplified drive signals supplied by amplifiers 136–150 will be biased to switch between voltage levels on either side of signal ground. Further, the signals will be scaled so that the semiconductor switching element will be positively driven into saturation when the drive signal is at a high voltage level and will be driven into cutoff when the drive signal is at a low voltage level.

For reliability purposes, each of the switching circuits 72–86 may include several commonly driven, parallel-connected transistors, each with a separate fuse element in the collector circuit. When connected in this manner, each fuse element would blow open if the associated switching transistor were to fail by a collector-emitter short. The transistor which failed would thus effectively be disconnected from the circuit, thereby allowing the parallel-connected transistor (or transistors) to continue to perform. This technique will be described further with respect to FIG. 6.

Switching circuits 72–86 are parallel-connected between signal ground and an output line 151. In order for a voltage signal to be generated along the output line 151, it will, of course, be necessary to connect output line 151 to a suitable voltage source through a load element. This is represented in FIG. 5 by load resistor 152. In an amplitude modulation scheme as shown in FIG. 2, load 12 will be an RF modulator, for example, an anode or cathode modulated Class C or Class D amplifier.

A filter capacitor 153 is provided which operates in conjunction with inductors 104–118 to provide the necessary output filtering. In this regard it will be noted that capacitor 153 serves as the "shunt" element of what is, essentially, a half-section low-pass filter. The "series" element of the filter comprises each of inductors 104–118. In situations where only a low-power switching circuit is required, resistive elements may be substituted in place of inductors 104–118. In any event, the output signal supplied to load 12 along output 151 will comprise the additive combination of the pulse duration modulators, as filtered through a half-section filter.

As mentioned earlier, the filtering which is required by the illustrated modulation system is greatly reduced over prior art systems. Thus, since the sampling frequency of the illustrated embodiment is effectively 320 kHz, the ripple frequency which would appear at the output of the circuit (but for filtering) would similarly be 320 kHz. Consequently, the transition band of the output filter may extend from 10 kHz (which is presumed, for purposes of discussion, to be the maximum frequency of the audio signal supplied by audio source 10) to over 300 kHz. The reduction in filtering by a factor of 4:1 is therefore permissible over prior systems.

As an added safety feature, it will be desirable in many applications to include a greater amount of filtering than is necessary to provide a selected degree of fidelity. This added measure of filtering would be provided to insure that, even were one of switching circuits 72–86 to fail, the overall fidelity provided by the amplifier would still not drop below the required level. A loss in fidelity would otherwise result because of the decrease in effective sampling rate and output ripple frequency which would accompany a failure of one of the switching circuits.

One of the many possible alternative switching circuits is illustrated in FIG. 6. In this Figure, which illustrates an alternate embodiment of only switching circuits 72 (the other switching circuits 74–86 being similar) high power switching SCR's 154–156 are used as switching elements in place of the high power transistor 88 utilized in the previously described embodiment. These SCR's are driven by a common input signal and will each be of the type which may be switched both ON and OFF by supplying signals of the appropriate voltage level to the gate input thereof. Thus each SCR will be switched ON when a positive voltage level signal is supplied to the gate input and will be switched OFF when a negative voltage level signal is supplied to the gate. Amplifier 136 will bias the drive signals to provide the required voltage levels.

Although each SCR is capable of handling the load current required of switching circuit 72, multiple SCR's are provided for reliability purposes. Thus, even if one or two of the SCR's were to fail, the third would still be capable of providing the required switching function. If an SCR were to fail by an anode-cathode open, this would of course effectively remove the defective switching element from the circuit. If it were to fail by an anode-cathode short, however, the entire switching circuit would be disabled. To prevent this from occurring, fuses 157–159 are provided in series with each of SCR's 154–156. These fuses will be selected to have a rating sufficient to survive normal operation of the SCR without blowing open. In the event of an anode-cathode short, however, the current through the fuse will increase beyond its capacity and it will open. The fuse will thus cause the defective element to be removed from the circuit, preventing interference with the operation of the good SCR's.

Although shown as including three SCR's, the number may be adjusted as desired to provide any degree of redundancy. Also, as stated previously, adequate filtering may be provided so that unacceptable loss of performance will not result even if all of the SCR's of a given switching circuit were to fail.

The switching rate of the switching elements must be adjusted to correspond to the design operating frequency of the individual switching elements. Since this frequency is approximately 10 kHz for the high power switching SCR's which would, currently, be used in this circuit, the actual switching rate will be constrained to be no greater than approximately 10 kHz. The number of switching circuits and PDM modulators will then be selected to provide the required degree of fidelity. If, for example, sixteen switching circuits are provided (rather than the eight shown in FIG. 5) and are operated at different phases, then the effective sampling rate and output ripple frequency will be sixteen times the switching rate of the individual switching circuits; 160 kHz in the example being discussed.

It is because of this ability to adjust the fidelity of the system independently of the switching rate of the individual elements that make it possible to use SCR's and other switching elements in these circuits. The use of these switching elements in a high fidelity output stage was not practical in the past due to their low design switching rate. The illustrated embodiments utilizing transistors and SCR's are, of course, examples of this. The approach is a general one, however, and may be applied to other types of switching elements as well.

An additional degree of freedom which is permitted in combining circuit 18 involves the arrangement of the switching devices in the output circuit. It will be appreciated that for every circuit involving current sources, there is an equivalent voltage dual (and vice-versa). Thus, the arrangement of FIG. 5 may be characterized as a parallel connection of a plurality of switched current sources, since the switching of each switching element serves to control the supply of an incremental amount of current to the load. An equivalent voltage dual will thus exist wherein a plurality of switchable, incremental voltage sources are connected together in series and then coupled to the load. Other arrangements are also possible.

Referring now to FIG. 7, an 8-phase clock which may be used in the system of FIG. 2 is illustrated. In the embodiment shown in FIG. 7, 8-phase clock 36 includes a clock oscillator 160 which is shown as operating at a frequency of 320 kHz. The eight square wave timing signals are derived from this clock signal by means of a flip-flop network comprised of flip-flops 162-174.

Figure 8:
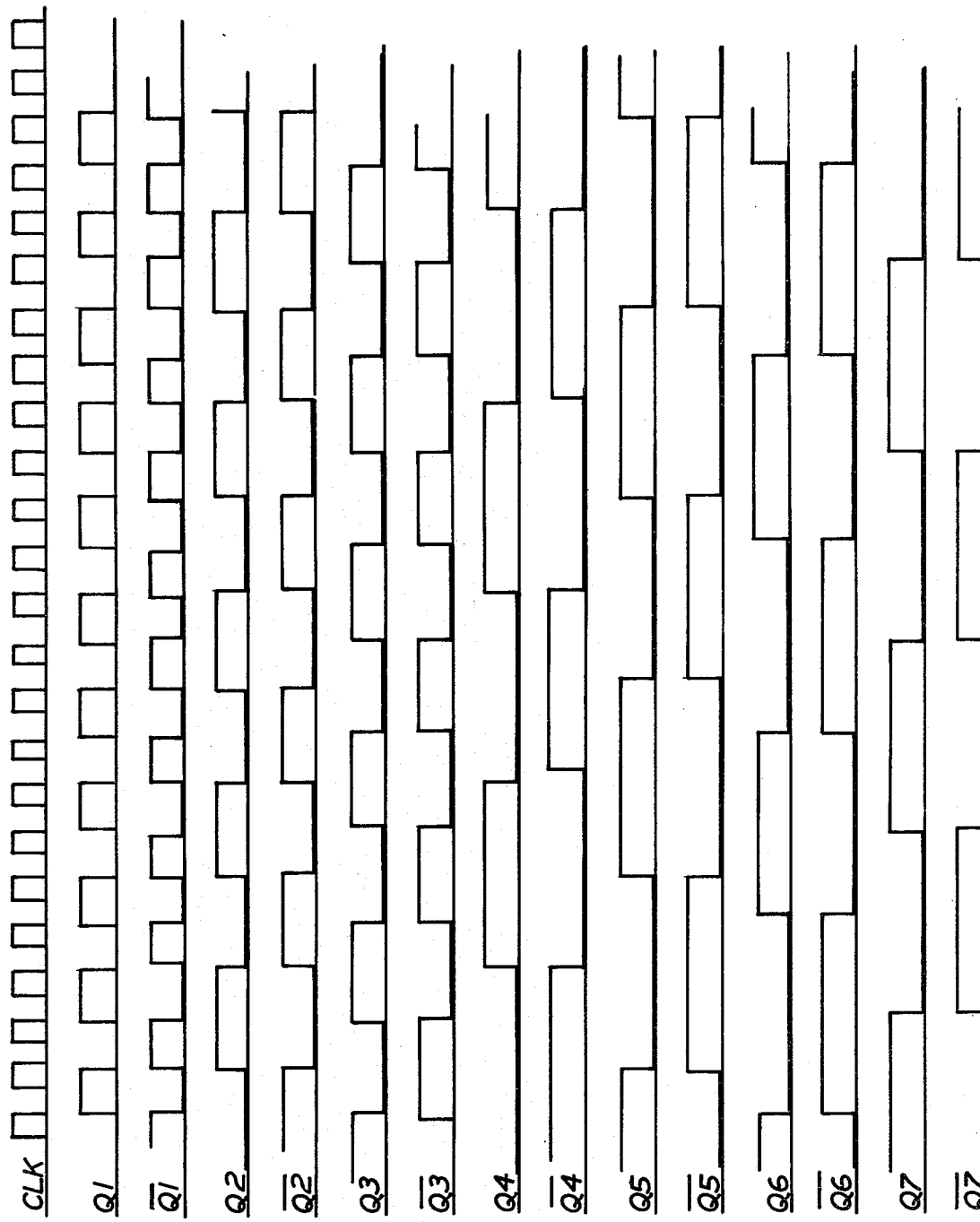
FIG. 8 illustrates the timing of the 8-phase clock shown in FIG. 7.

The operation of this circuit may be more readily understood through reference to the timing diagrams of FIG. 8. In reviewing these diagrams, it should be noted that flip-flops 162-174 are falling-edge triggered flip-flops which are triggered by the occurrence of transitions from a high logic level to a low logic level on the associated clock input. As shown in the timing diagrams, flip-flop 162 divides the 320 kHz square wave signal into two 160 kHz square wave signals which operate 180° out-of-phase with one another. Each of these 160 kHz square wave signals is further divided into two 80 kHz square wave signals by flip-flops 164 and 166. In a similar manner, the outputs of flip-flops 164 and 166 are further divided into eight 40 kHz signals of equally spaced phases by flip-flops 168-174. These eight outputs of flip-flops 168-174 serve as the 8-phase clock signals required of the system shown in FIG. 2.

In FIG. 9, there is shown a second embodiment of the present invention. This embodiment may be employed in the event that higher frequency switching devices are available. In this embodiment, the audio signal is sampled but once during each clock cycle. It is, therefore, necessary to employ the high switching rates used in the past in order to achieve the required fidelity. This approach will, however, allow simplification of the required filtering since the ripple frequency in the output is increased thereby.

In this embodiment, a single pulse duration modulator 200 responds to an audio signal supplied by audio signal source 202 and to a square wave signal supplied by a clock 204 to provide a PDM signal to a delay network 206. As in FIG. 2, pulse duration modulator 200 may include an integrator 208 and a comparator 210.

Delay network 206 is composed of seven series-connected delay circuits 212-224, which, preferably, each provide equal delays corresponding to one-eighth of the period of the clock signal supplied by clock 204. Delay circuits 212-224 could, for example, each comprise a multistage shift register operated at a high shifting rate by a high frequency clock (not shown). Eight PDM signals will thus be provided having equally spaced phases. As in FIG. 1, these eight PDM signals are directed to a combiner 18 and thence to a load 12.

A PDM amplifier has thus been described which allows the use of a significantly lower per-device switching rate than had generally been permissible in the prior art, but which provides the fidelity advantages inherent in the use of a considerably higher switching rate. The amplified signal is partially recovered by the mere recombination of a plurality of modulated pulse trains. Because of this unique effect, and because a much higher output ripple frequency exists, the amount of filtering required is much reduced over prior art requirements. This means that less distortion will be introduced thereby, leading to further improvements in fidelity while reducing the problem of overmodulation of a subsequent RF modulator stage due to overshoot of the amplified signal.

This amplifier additionally allows the use of high power switching elements whose use had been impractical in the past. Thus, transistors, SCRs and other high power switching devices may be employed in the output stage, as well as tubes. Because lower per-device switching rates are used, less expensive components may be utilized. Moreover, the lower per-device switching rates allow the system to operate more efficiently, thereby reducing the cooling and power supply requirements.

Although the invention has been described with respect to a preferred embodiment, it will be appreciated by those skilled in the art that any number of re-arrangements and alterations of parts as well as form may be made without departing from the spirit and scope of the invention as set forth herein and as defined in the appended claims.

What is claimed is:

1. An amplifier for providing high fidelity amplification of an amplitude and frequency varying input signal, comprising:
   means for providing said amplitude and frequency varying input signal;
   means responsive to said signal for converting said signal into a plurality of pulse trains of like polarity and frequency, but differing in phase from one another by a fixed amount, with the pulses of each said pulse train havng a characteristic which varies in a like manner with variations in said input signal; and, means for combining said plurality of pulse trains into a composite signal of increased magnitude and of substantially the same waveform as said amplitude and frequency varying input signal whereby high fidelity amplification of said amplitude and frequency varying input signal is provided.

2. Apparatus as set forth in claim 1 wherein said converting means includes means for varying the pulses in said pulse trains so that said pulses vary in duration dependent upon the magnitude and polarity of said input signal.

3. Apparatus as set forth in claim 1, wherein said converting means comprises at least two pulse duration modulators, each responsive to a respective synchronizing signal and to said amplitude and frequency varying input signal for each providing a said pulse train comprising periodically occurring pulses having pulse widths modulated in accordance with said amplitude and frequency varying input signal, and means for providing said synchronizing signals to each of said pulse duration modulators for controlling the operation thereof so that said pulse trains provided by said modulators all have substantially the same pulse repetition rate but have different relative phases.

4. Apparatus as set forth in claim 3, wherein said means for providing synchronizing signals comprises means for providing substantially square wave timing signals to each of said pulse duration modulators and wherein said square wave timing signals have substantially the same frequency but have different relative phases; and further wherein said pulse duration modulators each comprise means for generating a triangular wave reference signal from the corresponding said square wave timing signal, and comparing means for comparing the amplitude of said reference signal with the amplitude of said amplitude and frequency varying input signal so as to provide said pulse train upon the basis of said comparison.

5. Apparatus as set forth in claim 1, wherein said converting means comprises a pulse duration modulator responsive to said amplitude and frequency varying input signal for providing a pulse duration modulated output serving as one of said plurality of pulse trains, and delay means responsive to said pulse duration modulated output for providing a plurality of delayed pulse duration modulated outputs serving as the rest of said plurality of pulse trains.

6. An amplifier for providing high fidelity amplification of an amplitude and frequency varying input signal, comprising:

means for providing such amplitude and frequency varying input signal;

means responsive to said amplitude and frequency varying input signal for converting said signal into a plurality of pulse trains of like frequencies, but differing in phase from one another by a fixed amount, said pulse trains having pulses which vary in duration in functional dependence upon the magnitude and polarity of said input signal, said functional dependence being common to at least two of said pulse trains; and, means for combining said plurality of pulse trains into a composite signal of increased magnitude and of substantially the same waveform as said amplitude and frequency varying input signal, whereby high fidelity amplification of said amplitude and frequency varying signal is provided.

7. Apparatus as set forth in claim 6, wherein said converting means includes means for phase displacing said pulse trains by a known phase difference.

8. Apparatus as set forth in claim 6, wherein said means for combining said plurality of pulse trains comprises at least two parallel-connected switching circuits, each including at least one switching element responsive to a corresponding said pulse train.

9. Apparatus as set forth in claim 8, wherein each of said switching circuits includes at least two switching elements connected in parallel and responsive to the same said pulse train whereby said parallel connected switching elements perform the same function so that a failure of one of said switching elements will not result in loss of the function provided thereby.

10. Apparatus as set forth in claim 8, wherein said means for combining said pulse trains further comprises filtering means for filtering said composite signal so as to improve the fidelity thereof; said filtering means providing adequate filtering so that the fidelity of said composite signal will not drop below a selected minimum even in the event of failure of one of said switching circuits.

11. Apparatus as set forth in claim 8, wherein each of said switching elements comprises a semiconductor switching element.

12. Apparatus as set forth in claim 8, wherein each of said switching circuits further includes at least one filter element serially interconnected with the corresponding said at least one switching element.

13. Apparatus as set forth in claim 12, wherein each of said at least one filter elements comprises the series element of a half-section low-pass filter and wherein a single shunt element is provided in common for all of said parallel connected switching circuits and is connected in shunt therewith.

14. Apparatus as set forth in claim 6, wherein said converting means comprises at least two pulse duration modulators, each responsive to a respective synchronizing signal and to said amplitude and frequency varying input signal for each providing a said pulse train comprising periodically occurring pulses having pulse widths modulated in accordance with said amplitude and frequency varying input signal, and means for providing said synchronizing signals to each of said pulse duration modulators for controlling the operation thereof so that said pulse trains provided by said modulators all have substantially the same pulse repetition rate but have different relative phases.

15. Apparatus as set forth in claim 14, wherein said means for providing synchronizing signals comprises means for providing substantially square wave timing signals to each of said pulse duration modulators and wherein said square wave timing signals have substantially the same frequency but have different relative phases; and further wherein said pulse duration modulators each comprise means for generating a triangular wave reference signal from the corresponding said square wave timing signal, and comparing means for comparing the amplitude of said reference signal with the amplitude of said amplitude and frequency varying input signal so as to provide said pulse train upon the basis of said comparison.

16. Apparatus as set forth in claim 6, wherein said converting means comprises a pulse duration modulator responsive to said amplitude and frequency varying signal for providing a pulse duration modulated output serving as one of said plurality of pulse trains, and delay means responsive to said pulse duration modulated output for providing a plurality of delayed pulse duration modulated outputs serving as the rest of said plurality of pulse trains.

17. A high efficiency RF modulator comprising RF modulator means in combination with apparatus as set forth in claim 6, wherein said apparatus is adapted to respond to an audio signal which serves as said amplitude and frequency varying input signal so as to provide an amplified audio signal to said RF modulator means for modulating an RF carrier signal in accordance therewith.

18. A high efficiency RF modulator as set forth in claim 17 and wherein said RF modulator means comprises RF carrier signal generator means and a Class D RF amplitude modulator.

19. A pulse duration modulation amplifier comprising:
a plurality of pulse duration modulators, each responsive to a respective synchronizing signal and to a common input signal, for each providing a pulse train comprising periodically occurring pulses having pulse widths modulated in accordance with said common input signal;
means for providing synchronizing signals to each of said plurality of pulse duration modulators for controlling the timing of operation thereof so that said pulse trains provided by said modulators all have substantially the same pulse repetition rate but have different relative phases whereby each of said pulse duration modulators effectively serves to sample said common input signal at different times;
an output circuit; and
a like plurality of switching circuits coupled to said output circuit, each of said switching circuits operative to control the supply of an incremental signal to said output circuit, and each responsive to a corresponding said pulse train for controlling the operation thereof so as to thereby combine said outputs signals to provide a composite signal, corresponding to an amplified said input signal, to said output circuit; wherein said switching circuits are connected in parallel with one another, and wherein said parallel connected switching circuits are connected in series with said output circuit across a DC power supply.

20. A high efficiency RF amplitude modulation system comprising:
an RF carrier signal generator;
an RF modulator responsive to said RF carrier signal and to an amplified signal for modulating said RF carrier signal in accordance therewith; and,
amplifier means responsive to an input signal for supplying said amplified signal to said RF modulator, including at least two pulse modulators for each supplying an output signal comprising periodically occurring pulses which are modulated in accordance with said input signal, said output signals having substantially the same pulse repetition rate but differing in phase by a fixed amount, and means for amplifying and combining said output signals so as to thereby derive said amplified signal to be supplied to said RF modulator.

21. A high efficiency RF amplitude modulation system as set forth in claim 20, and further comprising means for providing a path along which DC current may flow for conducting said amplified signal to said RF modulator from said amplifier means.

22. A method of amplifying an amplitude and frequency varying input signal comprising the steps of:
providing a selected number of switching circuits;
connecting said circuits to a load such that the operation of each circuit serves to control the supply of an incremental signal to said load;
converting said amplitude and frequency varying input signal into a number of pulse trains corresponding to the number of said switching circuits, with each pulse train being composed of periodic pulses which vary in duration in functional dependence upon said input signal, said pulse trains having a common selected repetition rate, but having fixed discrete phase displacements therebetween and said functional dependence being common to at least two of said pulse trains; and,
controlling the operation of each of said switching circuits with a corresponding said pulse train whereby said load is supplied with a composite signal comprised of a combination of said pulse trains, said composite signal having the same waveform as said input signal but of greater magnitude.

23. A method as set forth in claim 22, further comprising the additional steps of:
selecting said repetition rate of said pulse trains as a function of the desired switching rate of said switching circuits; and
selecting the number of said switching circuits and said pulse trains as a function of the selected repetition rate and of the desired fidelity of amplification of said amplitude and frequency varying input signal.

24. A method as set forth in claim 22, further comprising the additional step of filtering said composite signal supplied to said load so as to increase the fidelity of said amplification.

25. A method as set forth in claim 24 wherein said step of filtering said composite signal includes the additional step of providing enough filtering so that, in the event that a said switching circuit should fail, the fidelity of said amplification will still not fall below a selected minimum.

* * * * *

REEXAMINATION CERTIFICATE (289th)
United States Patent [19]
Swanson

[11] B1 4,164,714
[45] Certificate Issued  Dec. 25, 1984

[54] POLYPHASE PDM AMPLIFIER

[75] Inventor: Hilmer I. Swanson, Quincy, Ill.

[73] Assignee: Harris Corporation, Cleveland, Ohio

Reexamination Request:
 No. 90/000,476, Dec. 5, 1983

Reexamination Certificate for:
 Patent No.: 4,164,714
 Issued: Aug. 14, 1979
 Appl. No.: 836,832
 Filed: Sep. 26, 1977

[51] Int. Cl.³ .............................................. H03F 3/38
[52] U.S. Cl. .................................. 330/10; 330/207 A; 330/251; 332/31 R
[58] Field of Search ................ 330/10, 207 A, 251; 332/31 R

[56] References Cited
U.S. PATENT DOCUMENTS

| | | | |
|---|---|---|---|
| 3,260,912 | 7/1966 | Gregory | 330/251 X |
| 3,510,751 | 5/1970 | Resch | |
| 3,579,132 | 5/1971 | Ross | 330/251 |
| 3,585,517 | 6/1971 | Herbert | 330/297 X |
| 3,629,616 | 12/1971 | Walker | 330/207 A |
| 3,643,149 | 2/1972 | Shirashoji | 318/111 X |
| 3,648,186 | 3/1972 | Kahn | 330/10 |
| 3,715,649 | 2/1973 | Ravas | |
| 4,004,246 | 1/1977 | Hamada | 330/251 X |

FOREIGN PATENT DOCUMENTS 861873  1/1953  Fed. Rep. of Germany.
1218557 12/1966  Fed. Rep. of Germany.

Primary Examiner—James B. Mullins

[57] ABSTRACT

A system wherein input signals are pulse duration modulated to provide a plurality of pulse trains having a predetermined phase relation therebetween. The plurality of pulse trains control the operation of separate switching elements. The output of the switching elements are summed and filtered to provide a composite amplified signal. The number of switching elements and the number of pulse trains are determined by the desired fidelity of operation and the frequency response of the switching elements. The system is particularly useful as a power audio amplifier for use in modulating stages of RF transmitters.

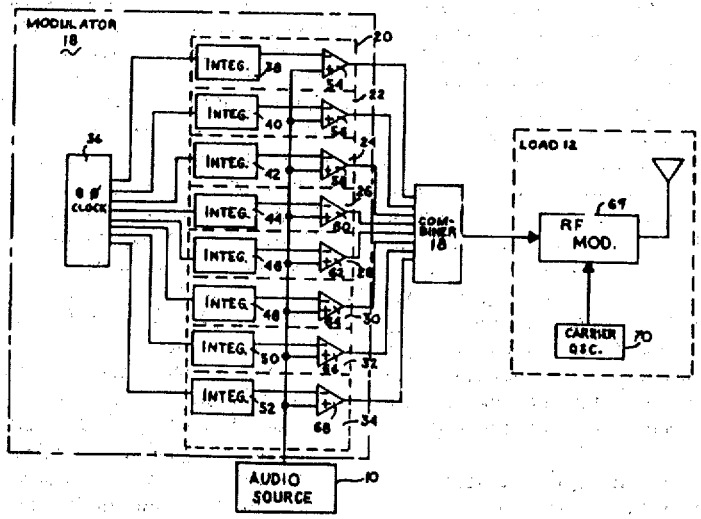

2

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 19 is confirmed.

Claims 2, 3, 5, 14 and 16 are cancelled.

Claims 1, 4, 6, 15, 20 and 22 are determined to be patentable as amended.

Claims 7-13, 17, 18, 21 and 23-25, dependent on an amended claim, are determined to be patentable.

1. An amplifier for providing high fidelity amplification of an amplitude and frequency varying input signal, comprising:
   means for providing said amplitude and frequency varying input signal;
   means responsive to said signal for converting said signal into a plurality of pulse trains of like polarity and frequency, but differing in phase from one another by a fixed amount, with the pulses of each said pulse train having a characteristic which varies in a like manner with variations in said input signal; and,
   means for combining said plurality of pulse trains into a composite signal of increased magnitude and of substantially the same waveform as said amplitude and frequency varying input signal whereby high fidelity amplification of said amplitude and frequency varying input signal is provided,
   *wherein said converting means comprises at least two pulse duration modulators, each responsive to a respective synchronizing signal and to said amplitude and frequency varying input signal for each providing a said pulse train comprising periodically occurring pulses having pulse widths modulated in accordance with said amplitude and frequency varying input signal, and means for providing said synchronizing signals to each of said pulse duration modulators for controlling the operation thereof so that said pulse trains provided by said modulators all have substantially the same pulse repetition rate but have different relative phases.*

4. Apparatus as set forth in claim [3] *1*, wherein said means for providing synchronizing signals comprises means for providing substantially square wave timing signals to each of said pulse duration modulators and wherein said square wave timing signals have substantially the same frequency but have different relative phases; and further wherein said pulse duration modulators each comprise means for generating a triangular wave reference signal from the corresponding said square wave timing signal, and comparing means for comparing the amplitude of said reference signal with the amplitude of said amplitude and frequency varying input signal so as to provide said pulse train upon the basis of said comparison.

6. An amplifier for providing high fidelity amplification of an amplitude and frequency varying input signal, comprising:
   means for providing such amplitude and frequency varying input signal;
   means responsive to said amplitude and frequency varying input signal for converting said signal into a plurality of pulse trains of like frequencies, but differing in phase from one another by a fixed amount, said pulse trains having pulses which vary in duration in functional dependence upon the magnitude and polarity of said input signal, said functional dependence being common to at least two of said pulse trains; and,
   means for combining said plurality of pulse trains into a composite signal of increased magnitude and of substantially the same waveform as said amplitude and frequency varying input signal, whereby high fidelity amplification of said amplitude and frequency varying signal is provided;
   *wherein said converting means comprises at least two pulse duration modulators, each responsive to a respective synchronizing signal and to said amplitude and frequency varying input signal for each providing a said pulse train comprising periodically occurring pulses having pulse widths modulated in accordance with said amplitude and frequency varying input signal, and means for providing said synchronizing signals to each of said pulse duration modulators for controlling the operation thereof so that said pulse trains provided by said modulators all have substantially the same pulse repetition rate but have different relative phases.*

15. Apparatus as set forth in claim [14] *6*, wherein said means for providing synchronizing signals comprises means for providing substantially square wave timing signals to each of said pulse duration modulators and wherein said square wave timing signals have substantially the same frequency but have different relative phases; and further wherein said pulse duration modulators each comprise means for generating a triangular wave reference signal from the corresponding said square wave timing signal, and comparing means for comparing the amplitude of said reference signal with the amplitude of said amplitude and frequency varying input signal so as to provide said pulse train upon the basis of said comparison.

20. A high efficiency RF amplitude modulation system comprising:
   an RF carrier signal generator;
   an RF modulator responsive to said RF carrier signal and to an amplified signal for modulating said RF carrier signal in accordance therewith; and,
   amplifier means responsive to an input signal for supplying said amplified signal to said RF modulator, including at least two pulse *duration* modulators [for] *operated at the same frequency but at different phases such that said modulators effectively sample said input signal at different times, said modulators* each supplying an output signal comprising periodically occurring pulses which are modulated in accordance with said input signal, said output signals having substantially the same pulse repetition rate but differing in phase by a fixed amount, and means for amplifying and combining said output signals so as to thereby derive said amplified signal to be supplied to said RF modulator.

22. A method of amplifying an amplitude and frequency varying input signal comprising the steps of:
providing a selected number of switching circuits;
connecting said circuits to a load such that the operation of each circuit serves to control the supply of an incremental signal to said load;
converting said amplitude and frequency varying input signal into a number of pulse trains corresponding to the number of said switching circuits, with each pulse train being composed of periodic pulses which vary in duration in functional dependence upon *the amplitude of said input signal at periodic points on* said input signal, *said periodic points being different for different ones of said pulse trains,* said pulse trains having a common selected repetition rate, but having fixed discrete phase displacements therebetween and said functional dependence being common to at least two of said pulse trains; and,
controlling the operation of each of said switching circuits with a corresponding said pulse train whereby said load is supplied with a composite signal comprised of a combination of said pulse trains, said composite signal having the same waveform as said input signal but of greater magnitude.

* * * * *